(12) United States Patent
Lai

(10) Patent No.: US 12,362,305 B2
(45) Date of Patent: Jul. 15, 2025

(54) SEMICONDUCTOR STRUCTURE

(71) Applicant: United Microelectronics Corp., Hsinchu (TW)

(72) Inventor: Chien-Ming Lai, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 495 days.

(21) Appl. No.: 17/980,568

(22) Filed: Nov. 4, 2022

(65) Prior Publication Data

US 2024/0120303 A1 Apr. 11, 2024

(30) Foreign Application Priority Data

Oct. 7, 2022 (TW) .................................. 111138224

(51) Int. Cl.
*H01L 23/48* (2006.01)
*H01L 23/00* (2006.01)
(Continued)

(52) U.S. Cl.
CPC ........ *H01L 24/08* (2013.01); *H01L 23/49822* (2013.01); *H01L 2224/08111* (2013.01); *H01L 2224/08147* (2013.01)

(58) Field of Classification Search
CPC ............... H01L 24/08; H01L 23/49822; H01L 2224/08111; H01L 2224/08147; H01L 24/05; H01L 2224/0603; H01L 2924/15311; H01L 25/0657; H01L 2224/48137; H01L 2224/32145; H01L 2224/48472; H01L 2224/49111; H01L 2224/83801; H01L 24/02; H01L 25/0655; H01L 24/09; H01L 2224/84801; H01L 2225/06517; H01L 2224/32014; H01L 2224/4847; H01L 2224/06133; H01L 2224/16237; H01L 2224/4846; H01L 2224/48464; H01L 2224/73203;
(Continued)

(56) References Cited

U.S. PATENT DOCUMENTS 9,425,126 B2  8/2016  Kuo et al.
9,691,733 B1  6/2017  Shen et al.
(Continued)

FOREIGN PATENT DOCUMENTS

CN  107046010       8/2017
CN  114122004 A  *  3/2022  ......... H01L 23/4334
JP  3146580         3/2001

OTHER PUBLICATIONS

"Search Report and Written Opinion of Singapore Counterpart Application", issued on Apr. 11, 2025, p. 1-p. 5.

*Primary Examiner* — Niki H Nguyen
(74) *Attorney, Agent, or Firm* — JCIPRNET

(57) ABSTRACT

A semiconductor structure including a first substrate, a first conductive layer, and first bonding pads is provided. The first conductive layer is located on the first substrate. The first conductive layer includes a main body portion and an extension portion. The extension portion is connected to the main body portion and includes a terminal portion away from the main body portion. The first bonding pads are connected to the main body portion and the extension portion. The number of the first bonding pads connected to the terminal portion of the extension portion is plural.

20 Claims, 6 Drawing Sheets

(51) Int. Cl.
   *H01L 23/498*   (2006.01)
   *H01L 23/52*   (2006.01)
   *H01L 29/40*   (2006.01)

(58) Field of Classification Search
   CPC ..... H01L 2924/1436; H01L 2924/1434; H01L 2224/02371; H01L 2224/08145; H01L 24/04; H01L 2225/1058; H01L 2224/49112; H01L 2224/06102; H01L 2224/04034; H01L 2224/08146; H01L 2224/05008; H01L 2224/06163; H01L 2224/06143; H01L 2224/81203; H01L 2224/84205; H01L 2225/0652; H01L 2924/15313; H01L 25/115
   See application file for complete search history.

(56) References Cited

U.S. PATENT DOCUMENTS

| | | | |
|---|---|---|---|
| 9,941,220 | B2 | 4/2018 | Hsu et al. |
| 2009/0225541 | A1* | 9/2009 | Gomi ................ H01L 25/0753 |
| | | | 362/231 |
| 2015/0333056 | A1 | 11/2015 | Du et al. |
| 2018/0248078 | A1* | 8/2018 | Kuo ..................... H10H 20/831 |
| 2022/0068731 | A1* | 3/2022 | Kwon ................ H01L 21/6835 |
| 2022/0115297 | A1 | 4/2022 | Shilmkar et al. |

\* cited by examiner

SEMICONDUCTOR STRUCTURE

CROSS-REFERENCE TO RELATED APPLICATION

This application claims the priority benefit of Taiwan application serial no. 111138224, filed on Oct. 7, 2022. The entirety of the above-mentioned patent application is hereby incorporated by reference herein and made a part of this specification.

BACKGROUND

Technical Field

The invention relates to a semiconductor structure, and particularly relates to a semiconductor structure having a bonding pad.

Description of Related Art

In the current bonding process, bonding is often performed by using bonding pads located on two substrates. The bonding pad is connected to the conductive layer thereunder. In some semiconductor structures, the conductive layer has a main body portion and an extension portion, and the number of the bonding pads connected to the terminal portion of the extension portion is one. After the bonding pad is formed, due to the difference in design of the main body portion and the extension portion (e.g., the difference in the number of the bonding pads and the area difference between the main body portion and the extension portion), it is easy to create the deeper recess in the bonding pad connected to the terminal portion of the extension portion due to the galvanic corrosion, thereby causing bonding failure in the subsequent bonding process.

SUMMARY

The invention provides a semiconductor structure, which can prevent the bonding pad connected to the terminal portion of the extension portion from bonding failure in the subsequent bonding process.

The invention provides a semiconductor structure, which includes a first substrate, a first conductive layer, and first bonding pads. The first conductive layer is located on the first substrate. The first conductive layer includes a main body portion and an extension portion. The extension portion is connected to the main body portion and includes a terminal portion away from the main body portion. The first bonding pads are connected to the main body portion and the extension portion. The number of the first bonding pads connected to the terminal portion of the extension portion is plural.

According to an embodiment of the invention, in the semiconductor structure, the number of the first bonding pads connected to the extension portion may be less than the number of the first bonding pads connected to the main body portion.

According to an embodiment of the invention, in the semiconductor structure, the number of the first bonding pads connected to the terminal portion of the extension portion may be less than the number of the first bonding pads connected to the main body portion.

According to an embodiment of the invention, in the semiconductor structure, the width of the terminal portion of the extension portion may be greater than the width of the rest of the extension portion.

According to an embodiment of the invention, in the semiconductor structure, the first bonding pads connected to the terminal portion of the extension portion may be arranged in a single direction.

According to an embodiment of the invention, in the semiconductor structure, the first bonding pads connected to the terminal portion of the extension portion may be arranged in an array.

According to an embodiment of the invention, the semiconductor structure may further include a first dielectric layer. The first dielectric layer is located on the first substrate. The first conductive layer and the first bonding pads may be located in the first dielectric layer.

According to an embodiment of the invention, the semiconductor structure may further include at least one second conductive layer and second bonding pads. The second conductive layer is located on the first substrate. The second bonding pads are connected to the second conductive layer.

According to an embodiment of the invention, in the semiconductor structure, the second conductive layer may be adjacent to the terminal portion of the extension portion.

According to an embodiment of the invention, in the semiconductor structure, the second conductive layer and the second bonding pads may be located in the first dielectric layer.

According to an embodiment of the invention, the semiconductor structure may further include a second substrate, a third conductive layer, and third bonding pads. The first substrate may be located on the second substrate. The third conductive layer is located on the second substrate. The third bonding pads are connected to the third conductive layer.

According to an embodiment of the invention, in the semiconductor structure, a portion of the first bonding pads may be bonded to the third bonding pads.

According to an embodiment of the invention, the semiconductor structure may further include a second dielectric layer. The second dielectric layer is located on the second substrate. The third conductive layer and the third bonding pads may be located in the second dielectric layer.

According to an embodiment of the invention, in the semiconductor structure, the first dielectric layer may be bonded to the second dielectric layer.

According to an embodiment of the invention, the semiconductor structure may further include at least one fourth conductive layer and fourth bonding pads. The fourth conductive layer is located on the second substrate. The fourth bonding pads are connected to the fourth conductive layer.

According to an embodiment of the invention, in the semiconductor structure, the fourth conductive layer and the fourth bonding pads may be located in the second dielectric layer.

According to an embodiment of the invention, in the semiconductor structure, a portion of the first bonding pads may be bonded to a portion of the fourth bonding pads. The second bonding pads may be bonded to another portion of the fourth bonding pads.

According to an embodiment of the invention, in the semiconductor structure, a portion of the vertical projection of the first conductive layer may fall on the third conductive layer. Another portion of the vertical projection of the first conductive layer may fall on the fourth conductive layer. A portion of the vertical projection of the second conductive layer may fall on the fourth conductive layer.

According to an embodiment of the invention, the semiconductor structure may further include at least one fifth conductive layer and at least one fifth bonding pad. The fifth conductive layer is located on the second substrate. The fifth bonding pad is connected to the fifth conductive layer.

According to an embodiment of the invention, in the semiconductor structure, a portion of the first bonding pads may be bonded to the fifth bonding pad.

Based on the above description, the semiconductor structure according to the invention includes the first conductive layer and the first bonding pads. The first conductive layer includes the main body portion and the extension portion. The extension portion is connected to the main body portion and includes the terminal portion away from the main body portion. Since the number of the first bonding pads connected to the terminal portion of the extension portion is plural, the galvanic corrosion occurring on the first bonding pad connected to the terminal portion of the extension portion can be effectively mitigated, thereby preventing the first bonding pad connected to the terminal portion of the extension portion from bonding failure in the subsequent bonding process.

In order to make the aforementioned and other objects, features and advantages of the invention comprehensible, several exemplary embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The embodiments are described in detail below with reference to the accompanying drawings, but the embodiments are not intended to limit the scope of the invention. For the sake of easy understanding, the same components in the following description will be denoted by the same reference symbols. In addition, the drawings are for illustrative purposes only and are not drawn to the original dimensions. In fact, the dimensions of the various features may be arbitrarily increased or reduced for clarity of discussion.

Figure 1:
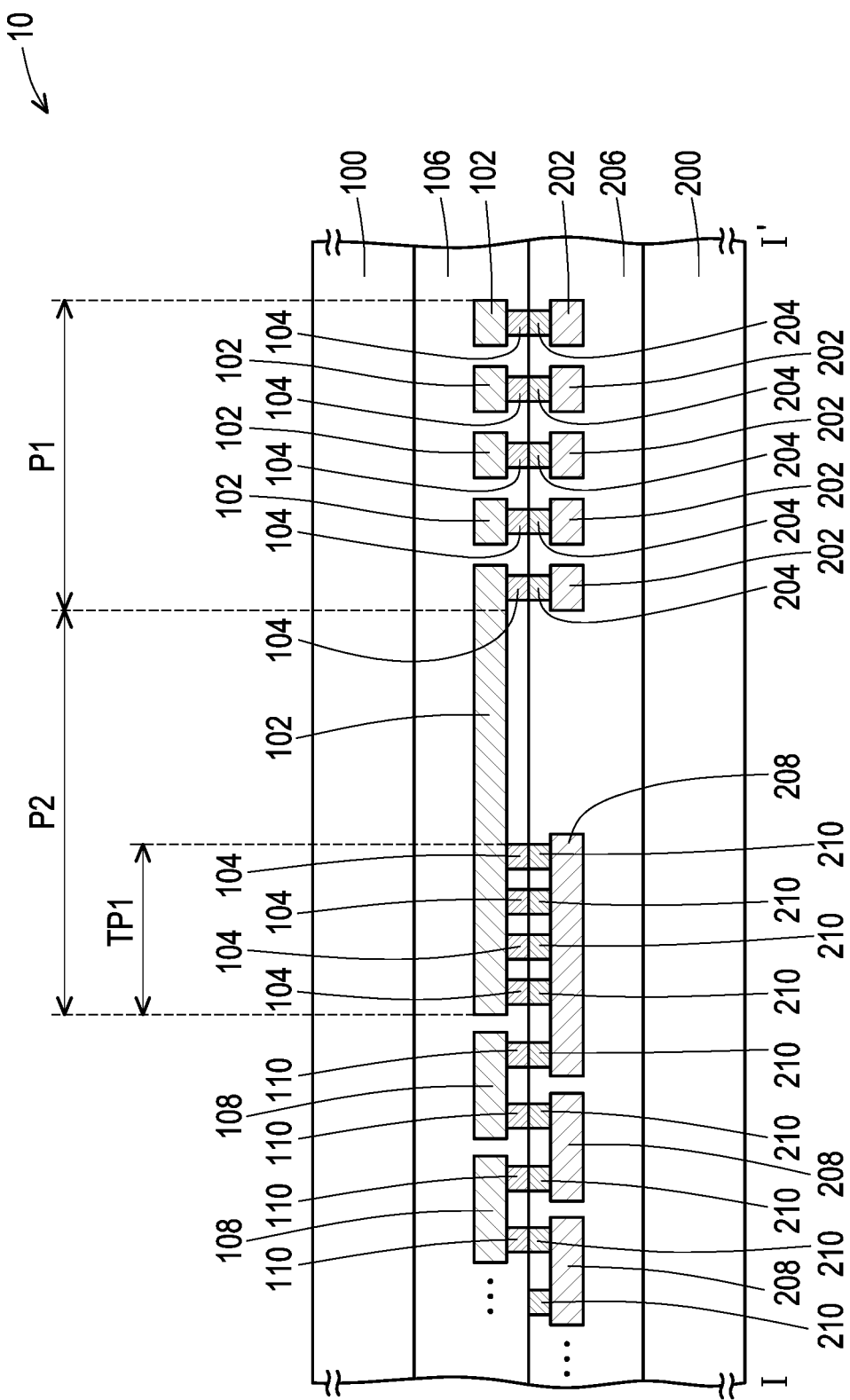
FIG. 1 is a cross-sectional view illustrating a semiconductor structure according to some embodiments of the invention.
Figure 2:
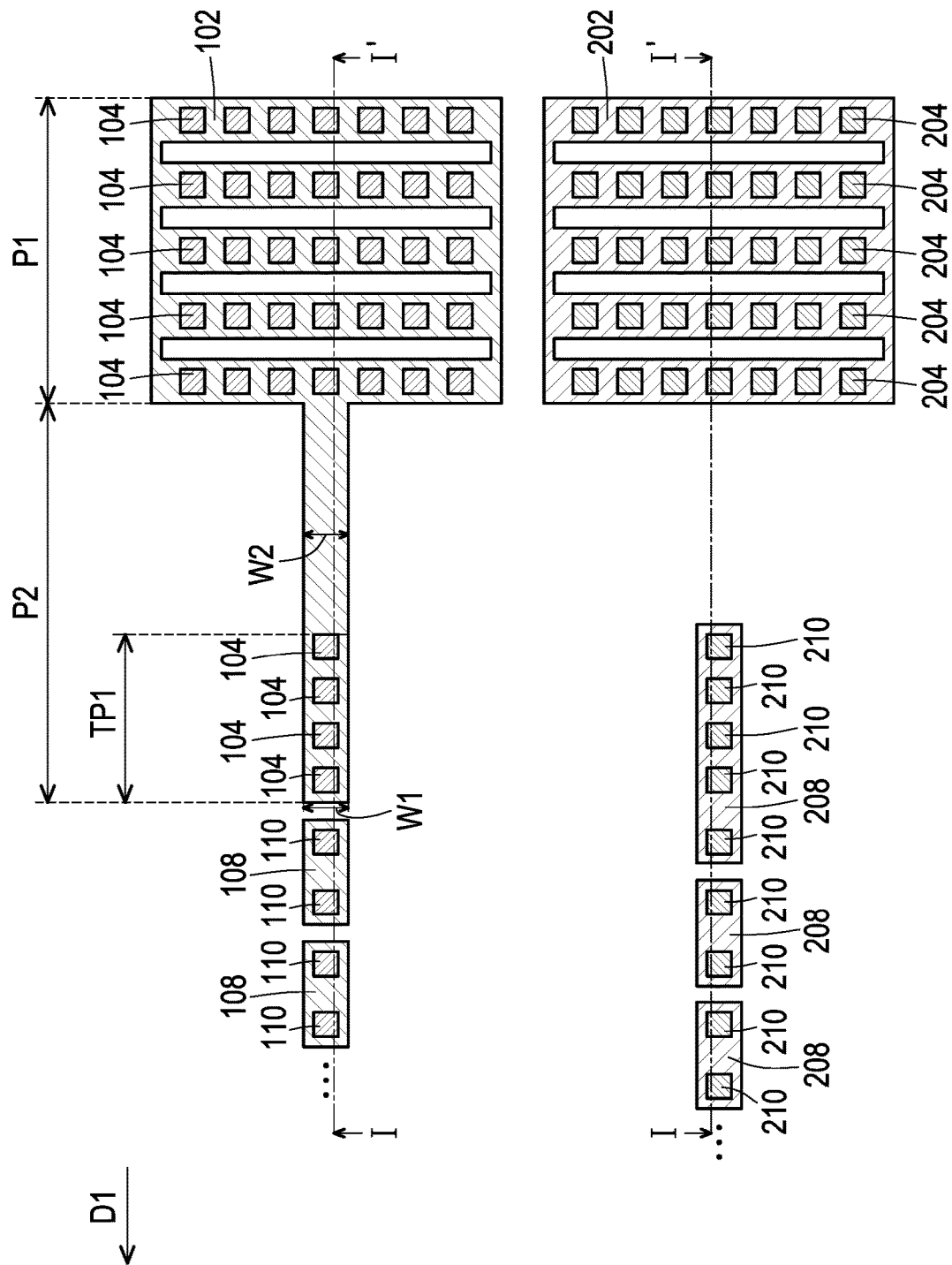
FIG. 2 is a top view illustrating the conductive layers and the bonding pads in FIG. 1.

FIG. 1 is a cross-sectional view illustrating a semiconductor structure according to some embodiments of the invention. FIG. 2 is a top view illustrating the conductive layers and the bonding pads in FIG. 1. FIG. 1 is a cross-sectional view taken along section line I-I' in FIG. 2.

Referring to FIG. 1 and FIG. 2, the semiconductor structure 10 includes a substrate 100, a conductive layer 102, and bonding pads 104. The substrate 100 may be a semiconductor substrate such as a silicon substrate. In addition, although not shown in the figure, the substrate 100 may have required components thereon, such as semiconductor devices (e.g., active devices and/or passive devices), and the description thereof is omitted here.

The conductive layer 102 is located on the substrate 100. The conductive layer 102 includes a main body portion P1 and an extension portion P2. The extension portion P2 is connected to the main body portion P1 and includes a terminal portion TP1 away from the main body portion P1. The extension portion P2 may extend in a direction D1 away from the main body portion P1. In addition, the top-view pattern of the conductive layer 102 is not limited to the pattern of FIG. 2. As long as the conductive layer 102 includes the main body portion P1 and the extension portion P2, it falls within the scope of the invention. The material of the conductive layer 102 is, for example, a conductive material such as copper.

The bonding pads 104 are connected to the main body portion P1 and the extension portion P2. The number of the bonding pads 104 connected to the terminal portion TP1 of the extension portion P2 is plural. Therefore, the galvanic corrosion occurring on the bonding pad 104 connected to the terminal portion TP1 of the extension portion P2 can be effectively mitigated, thereby preventing the bonding pad 104 connected to the terminal portion TP1 of the extension portion P2 from bonding failure in the subsequent bonding process. In some embodiments, the number of the bonding pads 104 connected to the extension portion P2 may be less than the number of the bonding pads 104 connected to the main body portion P1. In some embodiments, the number of the bonding pads 104 connected to the terminal portion TP1 of the extension portion P2 may be less than the number of the bonding pads 104 connected to the main body portion P1. In addition, the number of the bonding pads 104 connected to the terminal portion TP1 of the extension portion P2 is not limited to the number in the figure. As long as the number of the bonding pads 104 connected to the terminal portion TP1 of the extension portion P2 is plural, it falls within the scope of the invention. In some embodiments, the width W1 of the terminal portion TP1 of the extension portion P2 may be equal to the width W2 of the rest of the extension portion P2. In some embodiments, the bonding pads 104 connected to the terminal portion TP1 of the extension portion P2 may be arranged in a single direction (e.g., direction D1). The bonding pad 104 may be a single-layer structure or a multilayer structure. The material of the bonding pad 104 is, for example, copper, tantalum, tantalum nitride, or a combination thereof.

The semiconductor structure 10 may further include a dielectric layer 106. The dielectric layer 106 is located on the substrate 100. The conductive layer 102 and the bonding pads 104 may be located in the dielectric layer 106. In some embodiments, the dielectric layer 106 may be a multilayer structure. In addition, although not shown in the figure, the dielectric layer 106 may have required components therein, such as interconnect structures, and the description thereof is omitted here. The material of the dielectric layer 106 is, for example, silicon oxide, silicon nitride, silicon oxynitride, or a combination of related insulating materials.

The semiconductor structure 10 may further include at least one conductive layer 108 and bonding pads 110. The conductive layer 108 is located on the substrate 100. The conductive layer 108 may be located in the dielectric layer 106. The conductive layer 108 may be adjacent to the terminal portion TP1 of the extension portion P2. In the present embodiment, the number of the conductive layers 108 is, for example, plural, but the invention is not limited thereto. As long as the number of the conductive layers 108 is at least one, it falls within the scope of the invention. The material of the conductive layer 108 is, for example, a conductive material such as copper.

The bonding pads 110 are connected to the conductive layer 108. The bonding pads 110 may be located in the dielectric layer 106. In some embodiments, a plurality of the bonding pads 110 may be connected to the same conductive layer 108. The bonding pad 110 may be a single-layer structure or a multilayer structure. The material of the bonding pad 110 is, for example, copper, tantalum, tantalum nitride, or a combination thereof.

The semiconductor structure 10 may further include a substrate 200, a conductive layer 202, and bonding pads 204. The substrate 100 may be located on the substrate 200. The substrate 200 may be a semiconductor substrate such as a silicon substrate. In addition, although not shown in the figure, the substrate 200 may have required components thereon, such as semiconductor devices (e.g., active devices and/or passive devices), and the description thereof is omitted here.

The conductive layer 202 is located on the substrate 200. In some embodiments, a portion of the vertical projection of the conductive layer 102 may fall on the conductive layer 202. The material of the conductive layer 202 is, for example, a conductive material such as copper. The bonding pads 204 are connected to the conductive layer 202. A portion of the bonding pads 104 may be bonded to the bonding pads 204. The bonding pad 204 may be a single-layer structure or a multilayer structure. The material of the bonding pad 204 is, for example, copper, tantalum, tantalum nitride, or a combination thereof.

The semiconductor structure 10 may further include a dielectric layer 206. The dielectric layer 206 is located on the substrate 200. The dielectric layer 106 may be bonded to the dielectric layer 206. The conductive layer 202 and the bonding pads 204 may be located in the dielectric layer 206. In some embodiments, the dielectric layer 206 may be a multilayer structure. In addition, although not shown in the figure, the dielectric layer 206 may have required components therein, such as interconnect structures, and the description thereof is omitted here. The material of the dielectric layer 206 is, for example, silicon oxide, silicon nitride, silicon oxynitride, or a combination of related insulating materials.

The semiconductor structure 10 may further include at least one conductive layer 208 and bonding pads 210. The conductive layer 208 is located on the substrate 200. The conductive layer 208 may be located in the dielectric layer 206. Another portion of the vertical projection of the conductive layer 102 may fall on the conductive layer 208. A portion of the vertical projection of the conductive layer 108 may fall on the conductive layer 208. In the present embodiment, the number of the conductive layers 208 is, for example, plural, but the invention is not limited thereto. As long as the number of the conductive layers 208 is at least one, it falls within the scope of the invention. The material of the conductive layer 208 is, for example, a conductive material such as copper.

The bonding pads 210 are connected to the conductive layer 208. The bonding pads 210 may be located in the dielectric layer 206. In some embodiments, a plurality of the bonding pads 210 may be connected to the same conductive layer 208. A portion of the bonding pads 104 may be bonded to a portion of the bonding pads 210. The bonding pads 110 may be bonded to another portion of the bonding pads 210. The bonding pad 210 may be a single-layer structure or a multilayer structure. The material of the bonding pad 210 is, for example, copper, tantalum, tantalum nitride, or a combination thereof.

In some embodiments, the conductive layer 102, the conductive layer 202, the conductive layer 108, and the conductive layer 208 may be electrically connected to each other by the bonding pad 104, the bonding pad 204, the bonding pad 110, and the bonding pad 210.

Based on the above embodiments, the semiconductor structure 10 includes the conductive layer 102 and the bonding pads 104. The conductive layer 102 includes the main body portion P1 and the extension portion P2. The extension portion P2 is connected to the main body portion P1 and includes the terminal portion TP1 away from the main body portion P1. Since the number of the bonding pads 104 connected to the terminal portion TP1 of the extension portion P2 is plural, the galvanic corrosion occurring on the bonding pad 104 connected to the terminal portion TP1 of the extension portion P2 can be effectively mitigated, thereby preventing the bonding pad 104 connected to the terminal portion TP1 of the extension portion P2 from bonding failure in the subsequent bonding process.

Figure 3:
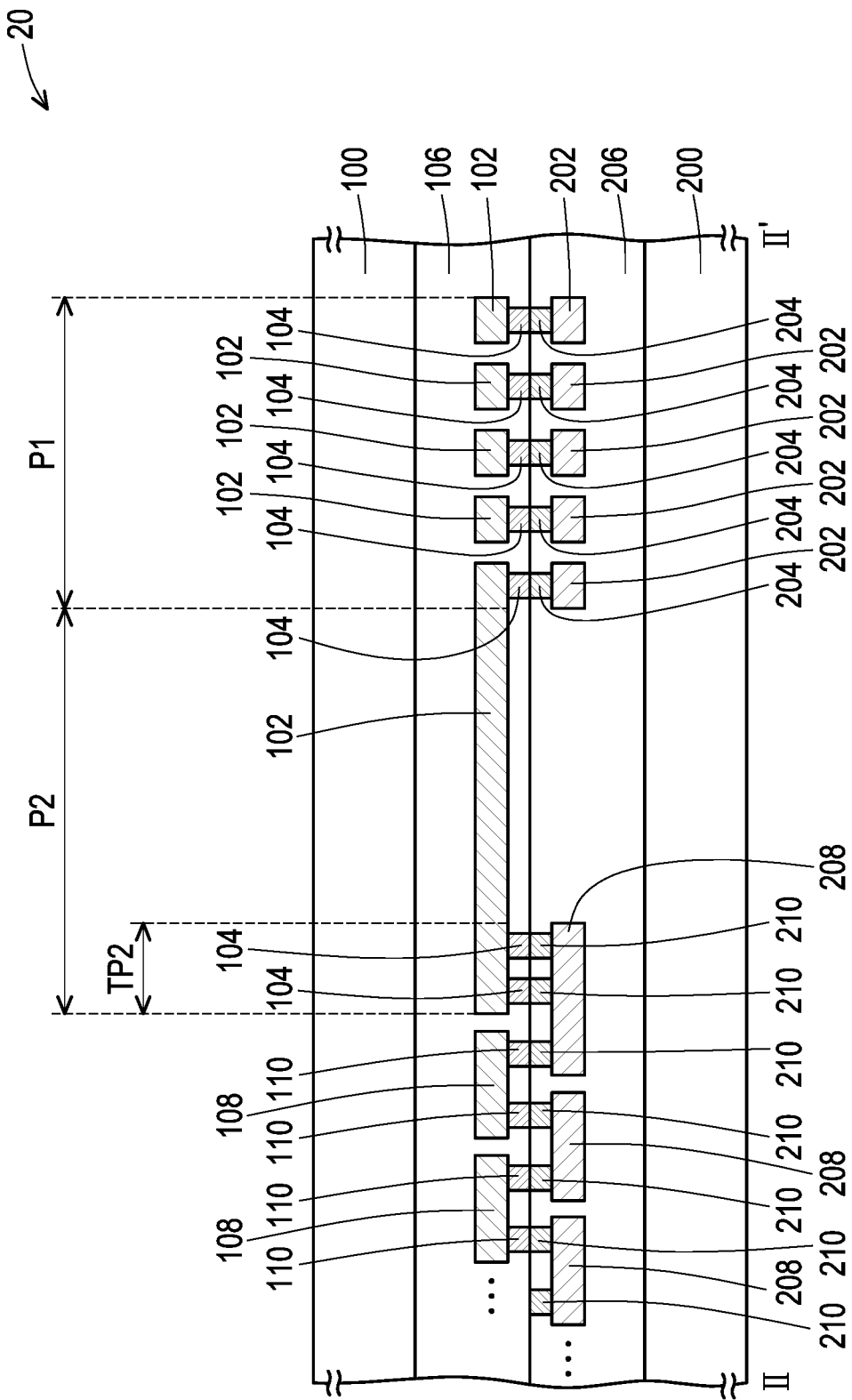
FIG. 3 is a cross-sectional view illustrating a semiconductor structure according to other embodiments of the invention.
Figure 4:
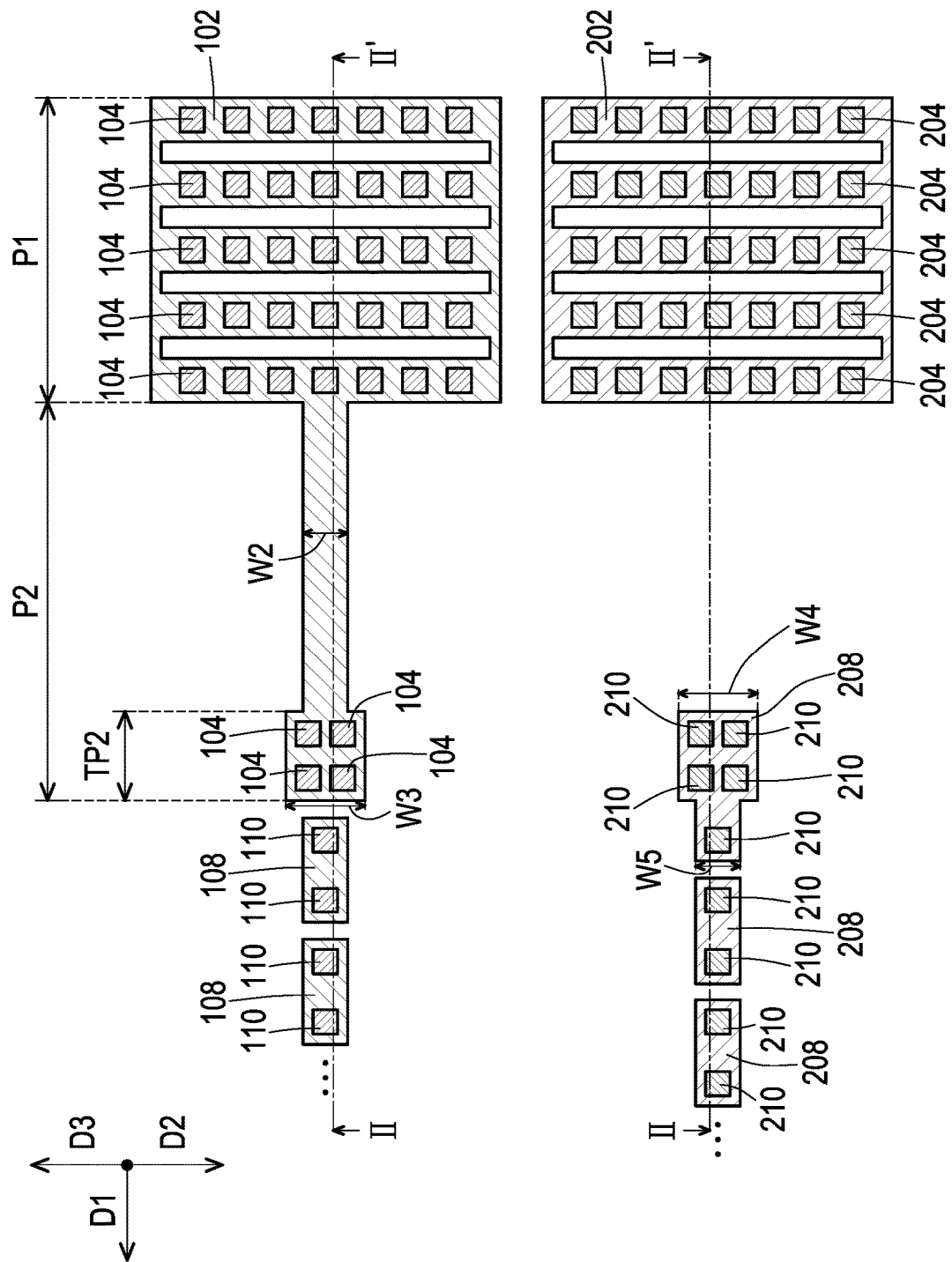
FIG. 4 is a top view illustrating the conductive layers and the bonding pads in FIG. 3.

FIG. 3 is a cross-sectional view illustrating a semiconductor structure according to other embodiments of the invention. FIG. 4 is a top view illustrating the conductive layers and the bonding pads in FIG. 3. FIG. 3 is a cross-sectional view taken along section line II-II' in FIG. 4.

Referring to FIG. 1 to FIG. 4, the difference between a semiconductor structure 20 and the semiconductor structure 10 is as follows. In the semiconductor structure 20, the width W3 of the terminal portion TP2 of the extension portion P2 may be greater than the width W2 of the rest of the extension portion P2. In some embodiments, the terminal portion TP2 of the extension portion P2 may extend in a direction D2 and a direction D3, that is, the extension direction of the extension portion P2 is turned at the terminal portion TP2. In some embodiments, the direction D2 and the direction D3 may intersect the direction D1. In the semiconductor structure 20, the bonding pads 104 connected to the terminal portion TP2 of the extension portion P2 may be arranged in an array. In addition, the number of the bonding pads 104 connected to the terminal portion TP2 of the extension portion P2 is not limited to the number in the figure. As long as the number of the bonding pads 104 connected to the terminal portion TP2 of the extension portion P2 is plural, it falls within the scope of the invention. In some embodiments, a portion of the conductive layer 208 corresponding to the terminal portion TP2 may have a width W4, a portion of the conductive layer 208 corresponding to the conductive layer 108 may have a width W5, and the width W4 may be greater than the width W5.

In addition, in the semiconductor structure 10 and the semiconductor structure 20, the same or similar components are denoted by the same reference symbols, and the description thereof is omitted.

Based on the above embodiments, the semiconductor structure 20 includes the conductive layer 102 and the bonding pads 104. The conductive layer 102 includes the main body portion P1 and the extension portion P2. The extension portion P2 is connected to the main body portion P1 and includes the terminal portion TP2 away from the main body portion P1. Since the number of the bonding pads 104 connected to the terminal portion TP2 of the extension portion P2 is plural, the galvanic corrosion occurring on the bonding pad 104 connected to the terminal portion TP2 of the extension portion P2 can be effectively mitigated, thereby preventing the bonding pad 104 connected to the terminal portion TP2 of the extension portion P2 from bonding failure in the subsequent bonding process.

Figure 5:
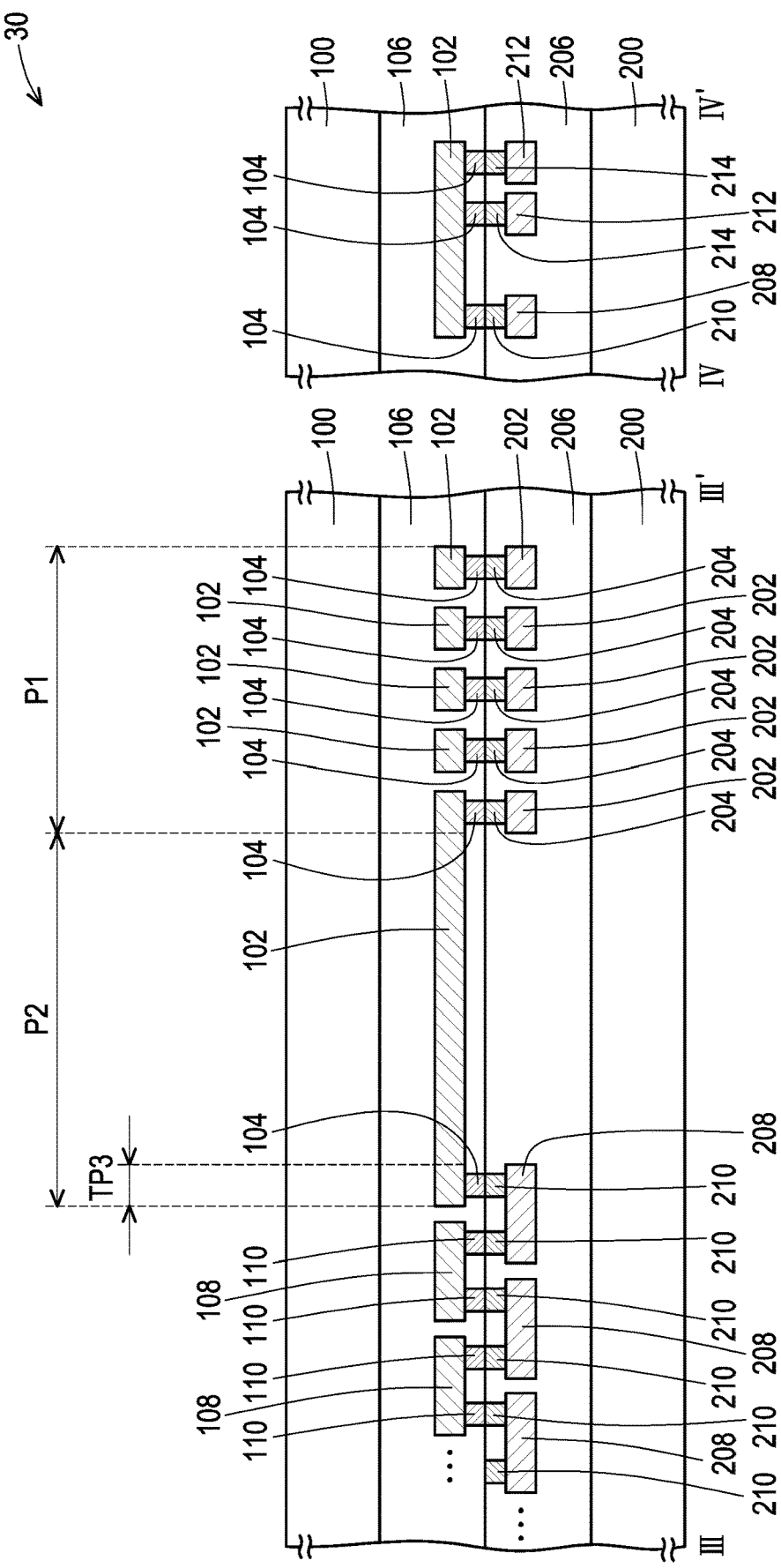
FIG. 5 is a cross-sectional view illustrating a semiconductor structure according to other embodiments of the invention.
Figure 6:
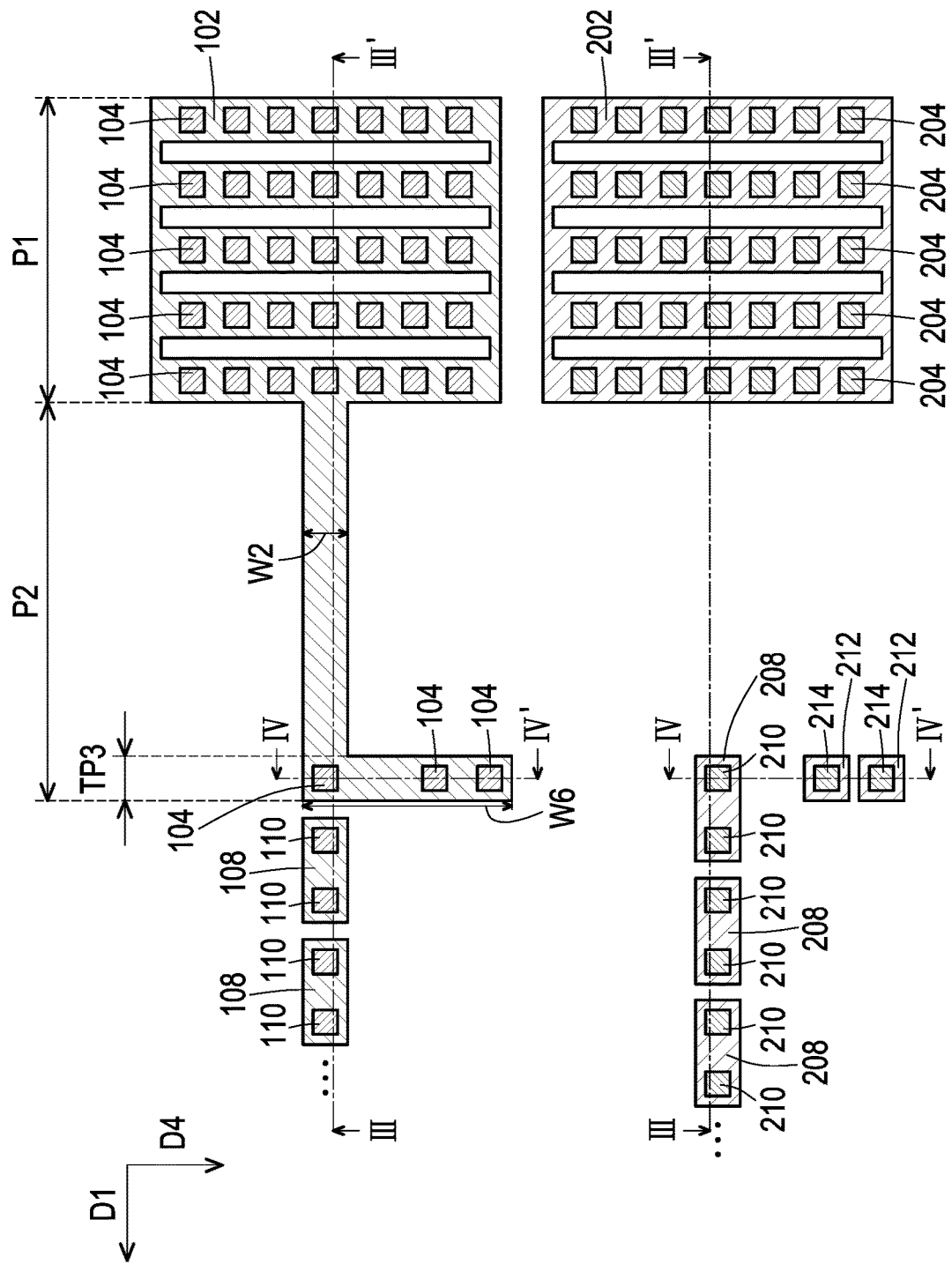
FIG. 6 is a top view illustrating the conductive layers and the bonding pads in FIG. 5.

FIG. 5 is a cross-sectional view illustrating a semiconductor structure according to other embodiments of the invention. FIG. 6 is a top view illustrating the conductive layers and the bonding pads in FIG. 5. FIG. 5 is a cross-sectional view taken along section line III-III' and section line IV-IV' in FIG. 6.

Referring to FIG. 1, FIG. 2, FIG. 5, and FIG. 6, the difference between the semiconductor structure 30 and the semiconductor structure 10 is as follows. In the semiconductor structure 30, the width W6 of the terminal portion TP3 of the extension portion P2 may be greater than the width W2 of the rest of the extension portion P2. In some embodiments, the terminal portion TP3 of the extension portion P2 may extend in a direction D4, that is, the extension direction of the extension portion P2 is turned at the terminal portion TP3. In some embodiments, the direction D4 may intersect the direction D1. In some embodiments, the bonding pads 104 connected to the terminal portion TP3 of the extension portion P2 may be arranged in a single direction (e.g., direction D4). In addition, the number of the bonding pads 104 connected to the terminal portion TP3 of the extension portion P2 is not limited to the number in the figure. As long as the number of the bonding pads 104 connected to the terminal portion TP3 of the extension portion P2 is plural, it falls within the scope of the invention.

In some embodiments, the semiconductor structure 30 may further include at least one conductive layer 212 and at least one bonding pad 214. The conductive layer 212 is located on the substrate 200. The conductive layer 212 may be located in the dielectric layer 206. Another portion of the vertical projection of the conductive layer 102 may fall on the conductive layer 212. In the present embodiment, the number of the conductive layers 212 is plural, but the invention is not limited thereto. As long as the number of the conductive layers 212 is at least one, it falls within the scope of the invention. The material of the conductive layer 212 is, for example, a conductive material such as copper.

The bonding pad 214 is connected to the conductive layer 212. The bonding pads 214 may be located in the dielectric layer 206. A portion of the bonding pads 104 may be bonded to the bonding pads 214. The bonding pad 214 may be a single-layer structure or a multilayer structure. In the present embodiment, the number of the bonding pads 214 is, for example, plural, but the invention is not limited thereto. As long as the number of the bonding pads 214 is at least one, it falls within the scope of the invention. The material of the bonding pad 214 is, for example, copper, tantalum, tantalum nitride, or a combination thereof.

In other embodiments, the semiconductor structure 30 may not include the conductive layer 212 and the bonding pads 214. In other embodiments, the semiconductor structure 30 may include the conductive layer 212, and the semiconductor structure 30 may not include the bonding pads 214.

In addition, in the semiconductor structure 10 and the semiconductor structure 30, the same or similar components are denoted by the same reference symbols, and the description thereof is omitted.

Based on the above embodiments, the semiconductor structure 30 includes the conductive layer 102 and the bonding pads 104. The conductive layer 102 includes the main body portion P1 and the extension portion P2. The extension portion P2 is connected to the main body portion P1 and includes the terminal portion TP3 away from the main body portion P1. Since the number of the bonding pads 104 connected to the terminal portion TP3 of the extension portion P2 is plural, the galvanic corrosion occurring on the bonding pad 104 connected to the terminal portion TP3 of the extension portion P2 can be effectively mitigated, thereby preventing the bonding pad 104 connected to the terminal portion TP3 of the extension portion P2 from bonding failure in the subsequent bonding process.

In summary, the semiconductor structure in the above embodiment includes the conductive layer and the bonding pads. The conductive layer includes the main body portion and the extension portion. The extension portion is connected to the main body portion and includes the terminal portion away from the main body portion. Since the number of the bonding pads connected to the terminal portion of the extension portion is plural, the galvanic corrosion occurring on the bonding pad connected to the terminal portion of the extension portion can be effectively mitigated, thereby preventing the bonding pad connected to the terminal portion of the extension portion from bonding failure in the subsequent bonding process.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A semiconductor structure, comprising:
   a first substrate;
   a first conductive layer located on the first substrate and comprising:
      a main body portion; and
      an extension portion connected to the main body portion and comprising a terminal portion away from the main body portion; and
   first bonding pads connected to the main body portion and the extension portion, wherein the number of the first bonding pads connected to the terminal portion of the extension portion is plural.

2. The semiconductor structure according to claim 1, wherein the number of the first bonding pads connected to the extension portion is less than the number of the first bonding pads connected to the main body portion.

3. The semiconductor structure according to claim 1, wherein the number of the first bonding pads connected to the terminal portion of the extension portion is less than the number of the first bonding pads connected to the main body portion.

4. The semiconductor structure according to claim 1, wherein a width of the terminal portion of the extension portion is greater than a width of the rest of the extension portion.

5. The semiconductor structure according to claim 1, wherein the first bonding pads connected to the terminal portion of the extension portion are arranged in a single direction.

6. The semiconductor structure according to claim 1, wherein the first bonding pads connected to the terminal portion of the extension portion are arranged in an array.

7. The semiconductor structure according to claim 1, further comprising:

a first dielectric layer located on the first substrate, wherein the first conductive layer and the first bonding pads are located in the first dielectric layer.

8. The semiconductor structure according to claim 7, further comprising:
   at least one second conductive layer located on the first substrate; and
   second bonding pads connected to the second conductive layer.

9. The semiconductor structure according to claim 8, wherein the second conductive layer is adjacent to the terminal portion of the extension portion.

10. The semiconductor structure according to claim 8, wherein the second conductive layer and the second bonding pads are located in the first dielectric layer.

11. The semiconductor structure according to claim 8, further comprising:
   a second substrate, wherein the first substrate is located on the second substrate;
   a third conductive layer located on the second substrate; and
   third bonding pads connected to the third conductive layer.

12. The semiconductor structure according to claim 11, wherein a portion of the first bonding pads is bonded to the third bonding pads.

13. The semiconductor structure according to claim 11, further comprising:
   a second dielectric layer located on the second substrate, wherein the third conductive layer and the third bonding pads are located in the second dielectric layer.

14. The semiconductor structure according to claim 13, wherein the first dielectric layer is bonded to the second dielectric layer.

15. The semiconductor structure according to claim 13, further comprising:
   at least one fourth conductive layer located on the second substrate; and
   fourth bonding pads connected to the fourth conductive layer.

16. The semiconductor structure according to claim 15, wherein the fourth conductive layer and the fourth bonding pads are located in the second dielectric layer.

17. The semiconductor structure according to claim 15, wherein
   a portion of the first bonding pads is bonded to a portion of the fourth bonding pads, and
   the second bonding pads are bonded to another portion of the fourth bonding pads.

18. The semiconductor structure according to claim 15, wherein
   a portion of a vertical projection of the first conductive layer falls on the third conductive layer,
   another portion of the vertical projection of the first conductive layer falls on the fourth conductive layer, and
   a portion of a vertical projection of the second conductive layer falls on the fourth conductive layer.

19. The semiconductor structure according to claim 15, further comprising:
   at least one fifth conductive layer located on the second substrate; and
   at least one fifth bonding pad, wherein the fifth bonding pad is connected to the fifth conductive layer.

20. The semiconductor structure according to claim 19, wherein a portion of the first bonding pads is bonded to the fifth bonding pad.

* * * * *